United States Patent [19]

Ramesh et al.

[11] Patent Number: 4,795,679
[45] Date of Patent: Jan. 3, 1989

[54] MONOCRYSTALLINE SILICON LAYERS ON SUBSTRATES

[75] Inventors: Subramanian Ramesh, Ossining; André M. Martinez, Wappingers Falls, both of N.Y.

[73] Assignee: North American Philips Corporation, New York, N.Y.

[21] Appl. No.: 42,542

[22] Filed: Apr. 23, 1987

Related U.S. Application Data

[63] Continuation of Ser. No. 736,922, May 22, 1985, abandoned.

[51] Int. Cl.⁴ .............................................. B32B 9/04
[52] U.S. Cl. ..................................... 428/428; 428/446; 428/701; 428/901; 156/610; 156/613; 156/DIG. 64
[58] Field of Search .............. 156/610, 613, DIG. 64; 428/428, 446, 901

[56] References Cited

U.S. PATENT DOCUMENTS

| | | | |
|---|---|---|---|
| 3,657,063 | 4/1972 | Brown et al. | 428/701 |
| 4,180,618 | 12/1979 | Alpha et al. | 428/428 |
| 4,202,928 | 5/1980 | Staebler | 428/446 |
| 4,292,091 | 9/1981 | Togei | 148/1.5 |
| 4,341,841 | 7/1982 | Ohno et al. | 428/414 |
| 4,371,421 | 2/1983 | Fan et al. | 156/624 |
| 4,431,460 | 2/1984 | Barson et al. | 148/1.5 |
| 4,492,736 | 1/1985 | Tanner | 428/446 |
| 4,502,913 | 3/1985 | Lechaton et al. | 156/643 |
| 4,526,631 | 7/1985 | Silvestri et al. | 148/175 |
| 4,528,047 | 7/1985 | Beyer et al. | 148/175 |
| 4,542,073 | 9/1985 | Tanaka et al. | 428/446 |

FOREIGN PATENT DOCUMENTS 0077020 4/1983 European Pat. Off. .

Primary Examiner—John E. Kittle
Assistant Examiner—P. J. Ryan
Attorney, Agent, or Firm—Norman N. Spain

[57] ABSTRACT

A capped recrystallizable silicon layer covering a substrate is provided with a thin buffer layer between the capping layer and the silicon layer. This recrystallizable silicon layer is then converted to a monocrystalline silicon layer.

19 Claims, 1 Drawing Sheet

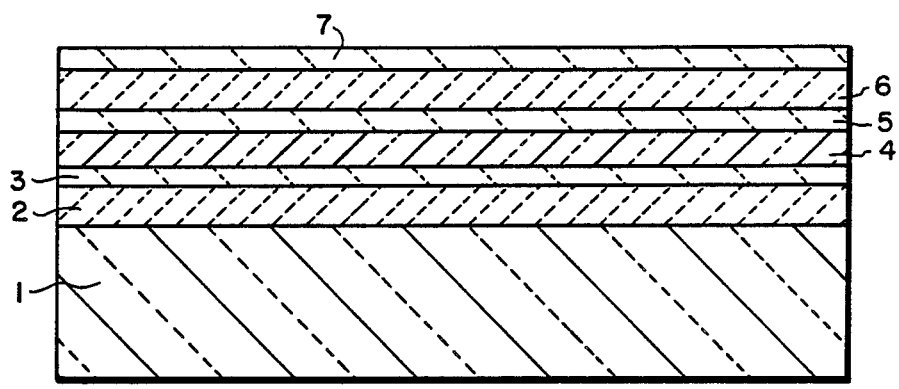

4,795,679

MONOCRYSTALLINE SILICON LAYERS ON SUBSTRATES

This is a continuation of application Ser. No. 736,922, filed May 22, 1985, now abandoned.

BACKGROUND OF THE INVENTION

This invention relates to semiconductor devices and more particularly to a method of manufacturing monocrystalline layers of silicon in such devices.

Monocrystalline silicon layers on substrates are used in many semiconductor devices. Such layers are useful for producing large area device arrays for flat panel displays, dielectrically insulated devices for high voltage and high frequency integrated devices and for many other applications. Such monocrystalline silicon layers have been produced by a method which involves first forming a sublayer of silicon dioxide on a substrate or a layer of another material which thermally matches the substrate, forming a recrystallizable layer of silicon on the sublayer, depositing at least one capping insulating layer on the recrystallizable silicon layer and then converting the recrystallizable silicon layer to a monocrystalline silicon layer. Typically such a conversion, involving melting and recrystallization may be carried out by radiation of a high intensity light or heat source such as a laser beam as described in J. G. K. Celler, J. Crystal Growth 53 (1980) 429-444 or by use of a strip heater as disclosed in M. W. Geis et al, Appl. Phys. Lett. 40 (2), January 1982, 158-160.

By use of methods well known in the semiconductor field, the monocrystalline silicon layer can then be fabricated for use in semiconductor devices.

The silicon dioxide sublayer provides a clean insulatng layer on top of the substrate and tends to reduce the tendency to cracking of the crystalline silicon layer due to the differences in thermal expansion coefficients between the substrate and the silicon layer. The capping layer acts to prevent agglomeration of the molten silicon during recrystallization and to prevent contamination of the polycrystalline silicon layer from atmospheric contaminants particularly during conversion of the recrystallizable layer to the monocrystalline layer and also acts as an insulator for the monocrystalline silicon layer during further fabrication.

However, the problem still exists of contamination of the recrystallized silicon layer by oxygen and other impurities from the capping layers and the sublayers particularly during conversion of the recrystallizable layer into the monocrystalline silicon layer. Further, the additional problem exists of the breaking up or the physical separation of the capping layer from the silicon layer during recrystallization.

SUMMARY OF THE INVENTION

A principal object of this invention therefore is to provide a method for producing a monocrystalline layer of silicon on a substrate by converting a recrystallizable layer of amorphous or polycrystalline silicon on a substrate to a monocrystalline silicon layer while the recrystallizable layer is covered by at least one capping insulating layer which method minimizes the tendency to separation of the capping layers from the resultant monocrystalline silicon layer during recrystallization and also minimizes the contamination of the monocrystalline silicon layer from contaminants from the other layers.

Another object of this invention is to provide a novel laminated structure comprising an insulating capped monocrystalline layer of silicon on a substrate which structure is particularly adapted for conventional silicon technology for fabrication of transistor devices. These and other aspects of the invention will be apparent from the following description.

According to the invention, a monocrystalline layer of silicon on a substrate is produced in the following manner:

A sublayer of silicon dioxide or a layer thermally matching the substrate is formed on the substrate. A recrystallizable layer of amorphous or polycrystalline silicon is then superimposed on the sublayer of silicon dioxide or the thermally matching layer. A thin buffer layer of silicon nitride, aluminum nitride or aluminum oxide is then formed on the recrystallizable layer. At least one capping insulating layer is then formed on the thin buffer layer and the recrystallizable silicon layer is then converted, for example by use of a high intensity light or heat source, to a monocrystalline silicon layer.

Due to the fact that the thin buffer layer tends to wet both the recrystallizable layer and the capping layer there tends to be a marked decrease in the tendency for separation between the capping layer and the resultant monocrystalline silicon layer. Further, the buffer layer provides a barrier between the capping layer and the recrystallizable layer and thus minimizes contamination of the resultant monocrystalline silicon layer from oxygen and other contaminants from the capping layer particularly during recrystallization.

While the buffer layer, situated between the capping layer and the recrystallizable layer, acts to prevent breaking up and separation of the capping layer from the monocrystalline silicon layer and tends to minimize contamination of the monocrystalline silicon layer by contaminating the capping layer, contamination of the recrystallizable layer by contaminants from the sublayers may also be minimized by an additional thin buffer layer of silicon nitride, aluminum nitride or aluminum oxide contacting the opposing surfaces of the sublayers and the recrystallizable silicon layer. This additional thin buffer layer also tends to provide additional mechanical strength to the structure.

While most of the contamination of the monocrystalline silicon layer takes place during recrystallization of the polycrystalline silicon layer, additional contamination may take place during subsequent fabrication. In such a case the thin buffer layers act to prevent further contamination of the monocrystalline silicon layer.

BRIEF DESCRIPTION OF THE DRAWING

The sole FIGURE in the drawing is a cross-sectional view of a laminated structure of the invention.

DETAILED DESCRIPTION OF THE INVENTION

For a more complete understanding the invention will now be described in greater detail.

As a substrate, materials well known in the semiconductor art may be employed: examples of such materials being quartz, glass, monocrystalline silicon, and sapphire. In general, the thickness of the substrate is about 0.2-2 mm, although the thickness of the substrate may vary considerably from this range.

One or more sublayers of silicon dioxide, silicon enriched silicon dioxide such as silicon crystallites in a silicon dioxide matrix, a silicon dioxide glass or other materials which thermally match the substrate are formed on the substrate usually by a chemical vapor deposition (CVD) technique and preferably by a low pressure chemical vapor deposition (LPCVD) technique. In general, the total thickness of the sublayer or layers is about 50 nm-3 μm.

The sublayer or semi-insulating film formed of silicon crystallites in a silicon dioxide matrix has been found to have a thermal expansion coefficient value lying between that of silicon and silicon dioxide or quartz. Such a semi-insulating film may be prepared at low pressures by a chemical vapor deposition (CVD) technique. For example, a mixture of silane ($SiH_4$) and either nitrous oxide ($N_2O$) or carbon dioxide ($CO_2$) reacts in a heated and partially evacuated chamber to deposit a thin film of the semi-insulating layer onto the surface of an insulating substrate. Such a method is described by H. Baumgart et al, Mat. Res. Soc. Symp. Proc. Vol. 33 (1984).

Typical deposition techniques utilized for a mixture of silane and nitrous oxide involve use of a temperature of around 650° C., a pressure of about 0.3 Torr, and a silane to nitrous oxide ratio of 2:1. Under these conditions, the silane and nitrous oxide convert to amorphous silicon in a silicon dioxide matrix, and gaseous products of $N_2$ and $H_2O$ are given off. A semi-insulating film is then grown to a thickness of at least one micron.

The film formed by the reaction of $SiH_4$ and $N_2O$ consists essentially of a mixture of amorphous silicon and silicon dioxide.

After annealing by heating the film to a temperature of about 900° C.-1100° C., by application of energy to a subsequently applied polycrystalline silicon layer, the amorphous silicon is converted to small silicon crystallites of 5 nm-10 nm in size.

While not necessary, a thin buffer layer of silicon nitride, aluminum nitride or aluminum oxide of a thickness of 5-500 nm is deposited on the sublayer. Preferably, deposition is caried out by an LPCVD technique, with a layer of silicon nitride formed.

A recrystallizable layer of amorphous or polycrystalline silicon of a thickness of about 0.2-20μ is deposited on the sublayer or, if present, on the thin buffer layer. Here too an LPCVD technique is preferably employed.

A thin buffer layer similar to the above-mentioned thin buffer layer is now applied to the layer of amorphous or polycrystalline silicon. Here too, the buffer layer preferably is of silicon nitride and has a thickness of about 5-50 nm.

At least one capping insulating layer is then deposited on the thin buffer layer. Preferably, a thin layer of silicon dioxide of a thickness of about 0.2-3 μm covered by an additional thin layer of silicon nitride of a thickness of about 5-80 nm is employed. Here too, deposition is preferably carried out by a LPCVD technique.

Conversion of the recrystallizable layer to monocrystalline silicon is then carried out preferably by use of a laser beam as described in the J. G. K. Celler article or by use of a strip heater as described in the M. W. Geis article.

For a more complete understanding the invention will now be described in greater detail with reference to the drawing the sole FIGURE of which is a cross-sectional view, not in scale, of a laminated structure of the invention.

Referring to the drawing, the following procedure was carried out:

On a quartz substrate 1 of a thickness of about 0.5 mm, a 1 μm thick layer 2 of silicon dioxide was deposited by means of a LPCVD process employing a mixture of $O_2$ (125 sccm) and $SiH_4$ (80 sccm) at a pressure of about 0.3 Torr and at a temperature of about 475° C. for a period of about 55 minutes. A 10 nm thick layer of silicon nitride 3 was then deposited on the silicon dioxide layer 2 by means of a LPCVD technique employing a mixture of $SiCl_2H_2$ (20.6 sccm) and $NH_3$ (61 sccm) at a pressure of 0.3 Torr at a temperature of about 800° C. for a period of three minutes.

A polycrystalline layer 4 of silicon of a thickness of about 520 nm was then deposited on the silicon nitride layer 3 also by means of a LPCVD technique employing $SiH_4$ (60 sccm) at a pressure of 0.3 Torr and a temperature of 620° C. for a period of 59 minutes.

In a manner similar to that employed for the eposition of silicon nitride layer 3 a 14 nm thick layer 5 of silicon nitride was deposited on the polycrystalline silicon layer 4.

A first capping layer 6 of silicon dioxide of a thickness of 2.2 μm was then deposited on the silicon nitride layer 5. A LPCVD technique similar to that used for the deposition of silicon dioxide layer 2 was employed but with a deposition time of about one hour 50 minutes.

A second capping layer 7 of silicon nitride of a thickness of about 700 nm was then deposited on the first capping layer 6 in a manner similar to that employed for silicon nitride layer 5 but with a deposition time of 22 minutes.

An alternate structure was fabricated in a similar manner, except that layer 2 was a semi-insulating film of a thickness of 1 μm of silicon crystallites in silicon dioxide as described previously.

Semiconductor devices may be fabricated according to methods known in the art from the laminated structure of the invention.

A CMOS inverter may be fabricated by the method described in J. F. Gibbons et al IEEE Electron Device Letters, Vol. EDL-1, No. 6, June 1980, pages 117-118 the contents of which, including FIG. 1, are hereby incorporated by reference.

CMOS devices may also be fabricated by the method described in J. P. Colinge et al IEEE Trans. Electron Devices, Vol. ED-29, No. 4, April 1982, pages 585-589, the cntents of which including FIG. 1, are hereby incorporated by reference.

What is claimed is:

1. A laminated structure particularly adapted for fabrication into a semiconductor device, said structure comprising a substrate, a sublayer of silicon dioxide or of a material thermally matching said substrate and contacting a surface of said substrate, a first thin buffer layer selected from the group consisting of silicon nitride, aluminum nitride, and aluminum oxide contacting the surface of said sublayer, a monocrystalline silicon layer superimposed on the surface of said first thin buffer, a second thin buffer layer selected from the group consisting of silicon nitride, aluminum nitride, and aluminum oxide contacting a surface of said monocrystalline silicon layer, a first capping insulating layer contacting a surface of said second thin buffer layer and including an additional capping insulating layer selected from the group consisting of silicon nitride, aluminum nitride and aluminum oxide superimposed on a surface of said first capping insulating layer.

2. A laminated structure of claim 1 wherein said thin buffer layers are layers of aluminum nitride.

3. The laminated structure of claim 1 wherein said thin buffer layers are layers of silicon nitride.

4. The laminated structure of claim 3 wherein the substrate is quartz, glass, monocrystalline silicon or sapphire.

5. The laminated structure of claim 4 wherein the sublayer is a layer of silicon dioxide.

6. The laminated structure of claim 18 wherein the sublayer is a layer of silicon enriched silicon dioxide.

7. A semiconductor device fabricated from the laminated structure of claim 1.

8. The method of claim 3 wherein said buffer layers are layers of aluminum nitride.

9. A method for producing a monocrystalline layer of silicon on a substrate layer, said method comprising:
 (a) forming a sublayer of silicon dioxide or a layer thermally matching said substrate on said substrate,
 (b) forming a first thin buffer layer selected from the group consisting of silicon nitride, aluminum nitride and aluminum oxide on said sublayer,
 (c) forming a recrystallizable layer of amorphous or polycrystalline silicon on said first thin buffer layer,
 (d) forming a second thin buffer layer selected from the group consising of silicon nitride, aluminum nitride and aluminum oxide on said recrystallizable layer,
 (e) forming a first capping insulating layer on said second thin buffer layer,
 (f) forming an additional capping insulating layer selected from the group consisting of silicon nitride, aluminum nitride and aluminum oxide on said first capping insulating layer, and
 (g) converting said recrystallizable layer into a monocrystalline silicon layer.

10. The method of claim 9 wherein said sublayer is selected from the group consisting of silicon dioxide and a silicon enriched silicon dioxide.

11. The method of claim 10 wherein said buffer layers are layers of silicon nitride.

12. The method of claim 11 wherein said buffer layers are 5-50 nm thick.

13. The method of claim 11 wherein said capping layers consist of a layer of silicon dioxide and a superimposed layer of silicon nitride with said layer of silicon dioxide adjacent to said second thin buffer layer.

14. The method of claim 13 wherein the substrate is quartz, glass, monocrystalline silicon or sapphire.

15. The method of claim 9 wherein said recrystallizable layer is converted into a monocrystalline silicon layer by irradiating said crystallizable layer with a high intensity light or heat source.

16. The method of claim 14 wherein said recrystallizable layer is converted into a monocrystalline silicon layer by irradiating said crystallizable layer with a high intensity light or heat source.

17. The method of claim 9 wherein said recrystallizable layer is converted into a monocrystalline silicon layer by irradiating said recrystallizable layer with a laser.

18. The method of claim 14 wherein said recrystallizable layer is converted into a monocrystalline silicon layer by irradiating said recrystallizable layer with a laser.

19. The method of claim 16 wherein said first thin buffer layer and said second thin buffer layer are from 5 to 50 nm thick.

* * * * *